(12) United States Patent
Kobayashi et al.

(10) Patent No.: US 10,114,393 B2
(45) Date of Patent: Oct. 30, 2018

(54) VOLTAGE REGULATOR WITH REFERENCE VOLTAGE SOFT START

(71) Applicant: SII Semiconductor Corporation, Chiba-shi, Chiba (JP)

(72) Inventors: Yuji Kobayashi, Chiba (JP); Takao Nakashimo, Chiba (JP)

(73) Assignee: ABLIC INC., Chiba-Shi, Chiba (JP)

( * ) Notice: Subject to any disclaimer, the term of this patent is extended or adjusted under 35 U.S.C. 154(b) by 0 days.

(21) Appl. No.: 15/272,726

(22) Filed: Sep. 22, 2016

(65) Prior Publication Data

US 2017/0090496 A1    Mar. 30, 2017

(30) Foreign Application Priority Data

Sep. 29, 2015   (JP) .................................. 2015-191875

(51) Int. Cl.
  *G05F 1/575*   (2006.01)
  *G05F 1/46*    (2006.01)
  *H02H 9/00*    (2006.01)
  *H03K 17/16*   (2006.01)

(52) U.S. Cl.
  CPC .............. *G05F 1/575* (2013.01); *G05F 1/468* (2013.01); *H02H 9/001* (2013.01); *H03K 17/163* (2013.01)

(58) Field of Classification Search
  CPC ....................................................... G05F 1/468
  See application file for complete search history.

(56) References Cited

U.S. PATENT DOCUMENTS

| 8,508,196 | B2 | 8/2013 | Deguchi | |
| 9,190,988 | B1* | 11/2015 | Gupta | H03K 17/22 |
| 2012/0062198 | A1* | 3/2012 | Takano | H02M 1/36 |
| | | | | 323/282 |
| 2015/0097534 | A1* | 4/2015 | Bhattad | G05F 1/462 |
| | | | | 323/270 |
| 2015/0241889 | A1* | 8/2015 | Chen | G05F 1/67 |
| | | | | 327/143 |
| 2016/0116927 | A1* | 4/2016 | Chen | H02M 1/36 |
| | | | | 323/280 |

FOREIGN PATENT DOCUMENTS

JP     2005-327027 A     11/2005

* cited by examiner

*Primary Examiner* — Harry Behm
(74) *Attorney, Agent, or Firm* — Brinks Gilson & Lione

(57) ABSTRACT

The voltage regulator includes a reference voltage circuit configured to feed back the reference voltage as a feedback voltage and to output the reference voltage, a soft-start circuit configured to output a control signal for controlling the reference voltage to rise linearly at a start of power supply, a voltage divider circuit configured to output a divided voltage, an error amplifier circuit configured to amplify and output a difference between the reference voltage and the divided voltage, and an output transistor controlled by an output voltage of the error amplifier circuit. The reference voltage circuit includes an analog switch transistor having a gate controlled by the control signal, and the feedback voltage is an output voltage from the analog switch transistor.

5 Claims, 3 Drawing Sheets

VOLTAGE REGULATOR WITH REFERENCE VOLTAGE SOFT START

RELATED APPLICATIONS

This application claims priority under 35 U.S.C. § 119 to Japanese Patent Application No. 2015-191875 filed on Sep. 29, 2015, the entire content of which is hereby incorporated by reference.

BACKGROUND OF THE INVENTION

1. Field of the Invention

The present invention relates to a voltage regulator including a soft-start circuit.

2. Description of the Related Art

A description is given of a related-art voltage regulator including a soft-start circuit. FIG. 3 is a circuit diagram for illustrating a voltage regulator 300 according to the related art.

The voltage regulator 300 includes a reference voltage circuit 301, a soft-start circuit 302, an error amplifier circuit 303, a voltage divider circuit 304, an output transistor 305, a ground terminal 306, a power supply terminal 307, and an output terminal 308.

The reference voltage circuit 301 includes a constant current circuit 31, NMOS transistors 32 and 33, and a resistor 34, and is configured to operate as described below to output a reference voltage VREF.

The NMOS transistor 32 is in an OFF state immediately after activation. Therefore, a gate voltage of the NMOS transistor 33 rises due to the constant current circuit 31, and the NMOS transistor 33 is placed in an ON state. When a current flows through the NMOS transistor 33, a voltage is generated at the resistor 34, and a gate voltage of the NMOS transistor 32 is controlled. Through feedback from a source terminal of the NMOS transistor 33 to a gate terminal of the NMOS transistor 32, a drain current of the NMOS transistor 33 is adjusted such that a current caused to flow by the constant current circuit 31 and the drain current of the NMOS transistor 32 are equal, to thereby generate VREF by the resistor 34.

The soft-start circuit 302 includes an analog switch transistor 35, constant current circuits 36 and 37, and a capacitor 38, and is configured to operate as described below to output a reference voltage VREF_SS for soft start.

The constant current circuit 36 charges the capacitor 38. Then, the voltage of the capacitor 38 rises linearly, and a gate voltage of the switch transistor 35 is controlled. When the constant current circuit 37 causes the current to flow continuously, the switch transistor 35 operates as a source follower circuit. Therefore, the reference voltage VREF, which is output from the reference voltage circuit 301, is output from the switch transistor 35 as a reference voltage VREF_SS for soft start, which rises gradually from the start of activation.

An error amplifier circuit 303 is configured to compare VREF_SS output from the soft-start circuit 302 and a divided voltage of the voltage divider circuit 304, and to control a gate voltage of the output transistor 305 such that VREF_SS and the divided voltage has the same voltage.

In this way, the soft start of the voltage regulator is performed (see, for example, Japanese Patent Application Laid-open No. 2011-152023 and Japanese Patent Application Laid-open No. 2005-327027).

However, in the related-art voltage regulator 300, when a current with a current value Is caused to flow through the analog switch transistor 35 by the constant current circuit 37, an ON resistance (the resistance value is denoted by Ron) is generated at the switch transistor 35, and the reference voltage VREF_SS drops from the reference voltage VREF by a value obtained by Is×Ron. More specifically, there is a problem in that, when the switch transistor 35 configured to control the soft start time is used between the output of the reference voltage circuit 301 and the error amplifier circuit 303, a difference is generated between the voltage VREF_SS of an inverting input terminal of the error amplifier circuit 303 and the reference voltage VREF due to the ON resistance of the switch transistor 35.

When a W length of the switch transistor 35 is increased in order to reduce the amount of voltage drop by the switch transistor 35, the ON resistance is reduced. However, a capacitance between the drain and the gate is enlarged, and when the capacitor 38 is externally connected, malfunction due to external noise is prone to occur. Further, when the current value Is of the constant current circuit 37 is reduced, there arises a problem in that a node between the error amplifier circuit 303 and the switch transistor 35 becomes Hi-Z to increase the possibility of malfunction due to external noise.

SUMMARY OF THE INVENTION

Therefore, in view of the problems described above, the present invention provides a voltage regulator in which, even when an analog switch transistor configured to control a soft start time is used, a difference is not generated between a voltage of an inverting input terminal of an error amplifier circuit and a reference voltage output by a reference voltage circuit.

In order to solve the problems in the related art, according to one embodiment of the present invention, there is provided a voltage regulator, including: a power supply terminal to which an external power voltage is supplied; an output terminal configured to output a voltage generated by adjusting the external power voltage; a reference voltage circuit configured to feed back a reference voltage as a feedback voltage and to output the reference voltage; a soft-start circuit configured to output a control signal for controlling the reference voltage to rise linearly at a start of power supply; a voltage divider circuit configured to divide a voltage of the output terminal to generate a divided voltage; an error amplifier circuit configured to amplify and output a difference between the reference voltage and the divided voltage; and an output transistor having a gate controlled by an output voltage of the error amplifier circuit, and a drain connected to the output terminal, the reference voltage circuit including an analog switch transistor having a gate controlled by the control signal, the feedback voltage being an output voltage of the analog switch transistor.

According to the voltage regulator of the present invention, an analog switch transistor is not arranged between the output of the reference voltage circuit and the inverting input terminal of the error amplifier circuit. Therefore, the reference voltage output by the reference voltage circuit and the voltage of the inverting input terminal of the error amplifier circuit can have the same potential without a difference being generated therebetween. As a result, the malfunction due to the external noise can be prevented.

DETAILED DESCRIPTION OF THE PREFERRED EMBODIMENTS

First Embodiment

Figure 1:
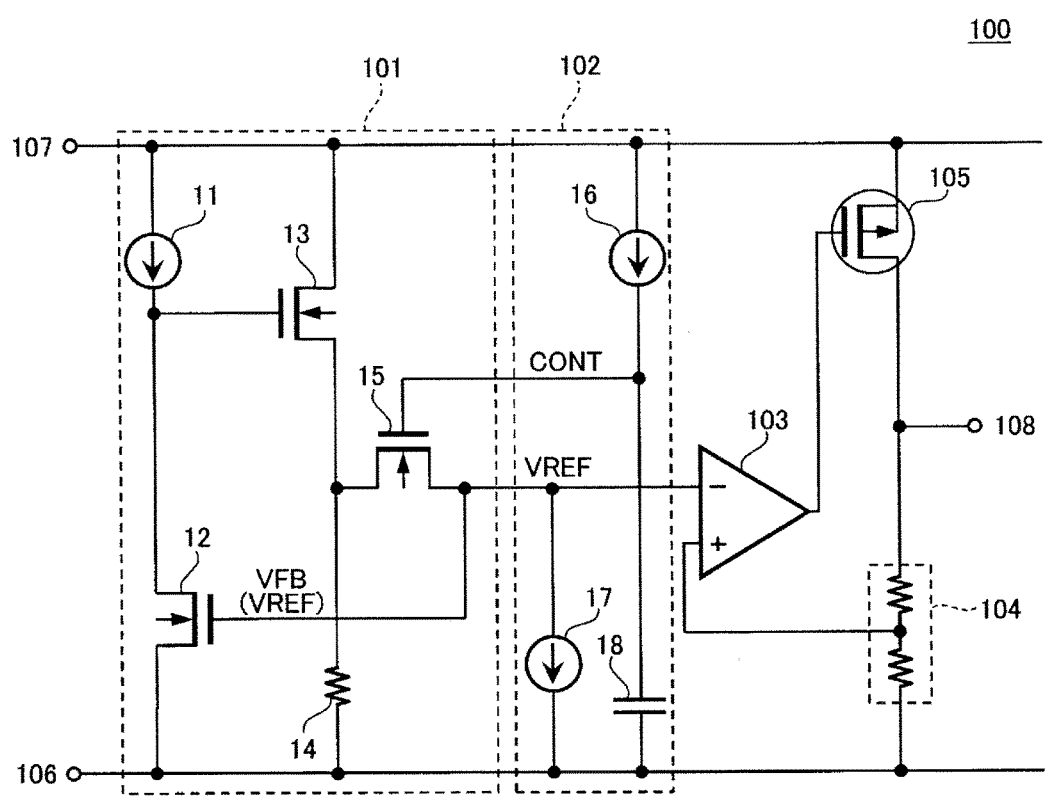
FIG. 1 is a circuit diagram of a voltage regulator according to a first embodiment of the present invention.

FIG. 1 is a circuit diagram of a voltage regulator 100 according to one embodiment of the present invention. The voltage regulator 100 includes a reference voltage circuit 101, a soft-start circuit 102, an error amplifier circuit 103, a voltage divider circuit 104, an output transistor 105, a ground terminal 106 to which a ground voltage is supplied, a power supply terminal 107 to which an external power voltage is supplied, and an output terminal 108.

The reference voltage circuit 101 includes a constant current circuit 11, NMOS transistors 12 and 13, an analog switch transistor 15, and a resistor 14.

The soft-start circuit 102 includes constant current circuits 16 and 17 and a capacitor 18.

The constant current circuit 11 in the reference voltage circuit 101 is connected between the power supply terminal 107 and a gate terminal of the NMOS transistor 13. The NMOS transistor 12 has a source terminal connected to the ground terminal 106, a drain terminal connected to the gate terminal of the NMOS transistor 13, and a gate terminal connected to a source terminal of the analog switch transistor 15, to the constant current circuit 17, and to an inverting input terminal of the error amplifier circuit 103. The NMOS transistor 13 has a drain terminal connected to the power supply terminal 107 and a source terminal connected to the ground terminal 106 via the resistor 14. Further, the source terminal of the NMOS transistor 13 is also connected to a drain terminal of the analog switch transistor 15.

The capacitor 18 of the soft-start circuit 102 has one end connected to the power supply terminal 107 via the constant current circuit 16, and another end connected to the ground terminal 106. One end of the capacitor 18 is an output of the soft-start circuit 102 and is connected to a gate terminal of the analog switch transistor 15.

The error amplifier circuit 103 has an output connected to a gate terminal of the output transistor 105, and has a non-inverting input terminal configured to receive a divided voltage that is resistance-divided by the voltage divider circuit 104. The output transistor 15 has a source terminal connected to the power supply terminal 107, and a drain terminal connected to the ground terminal 106 via the voltage divider circuit 104. Further, a connection point between the output transistor 15 and the voltage divider circuit 104 is connected to the output terminal 108.

Next, an operation of the voltage regulator 100 of this embodiment is described.

The NMOS transistor 12 of the reference voltage circuit 101 is in an OFF state immediately after power supply is started. Therefore, the gate voltage of the NMOS transistor 13 rises due to the current of the constant current circuit 11, and the NMOS transistor 13 is placed in an ON state. However, the analog switch transistor 15 is in an OFF state, and a feedback to the gate terminal of the NMOS transistor 12 is thus not performed. As a result, a gate voltage of the NMOS transistor 12 may not be controlled.

The analog switch transistor 15 has a gate voltage controlled by output of the soft-start circuit 102, that is, a control voltage CONT generated at a connection point between the constant current circuit 16 and the capacitor 18, and is configured to cause a drain current to flow when the gate voltage exceeds a threshold voltage, to thereby operate as a source follower circuit. As a result, a reference voltage VREF generated at the source terminal of the analog switch transistor 15 is fed back to the gate terminal of the NMOS transistor 12 as a feedback voltage VFB. The NMOS transistor 12 is placed in an ON state due to the rise of the feedback voltage VFB. More specifically, a feedback with a voltage to which an ON resistance of the analog switch transistor 15 is added is performed to the gate terminal of the NMOS transistor 12. Then, the reference voltage VREF is generated at the source terminal of the analog switch transistor 15 such that the current caused to flow by the constant current circuit 11 and the drain current of the NMOS transistor 12 are equal.

In this way, the reference voltage VREF, which is output from the reference voltage circuit 101, may be directly input to the inverting input terminal of the error amplifier circuit 103. Further, the analog switch transistor 15 operates as the source follower circuit, and thus the reference voltage VREF rises gradually within a soft start time that is defined by the constant current circuit 16 and the capacitor 18.

Further, there is no problem with the ON resistance of the analog switch transistor 15 being high, and therefore the size of a W length may be reduced to enable a reduction in dimension.

As described above, in the voltage regulator 100 of this embodiment, the switch transistor is not arranged between the output of the reference voltage circuit 101 and the inverting input terminal of the error amplifier circuit 103. Therefore, the reference voltage VREF, which is output from the reference voltage circuit 103, is directly input to the inverting input terminal of the error amplifier circuit. More specifically, the output voltage of the reference voltage circuit 101 and the voltage of the inverting input terminal of the error amplifier circuit can have the same potential without a difference being generated therebetween.

Second Embodiment

Figure 2:
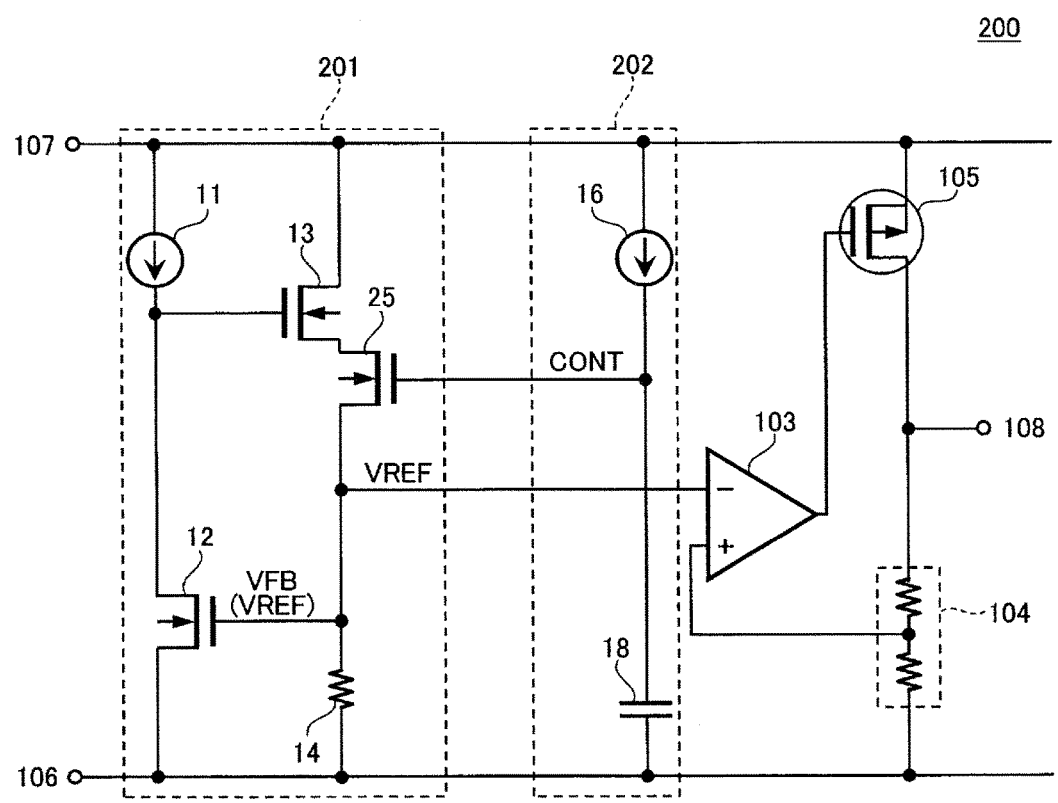
FIG. 2 is a circuit diagram for illustrating a voltage regulator according to a second embodiment of the present invention.
Figure 3:
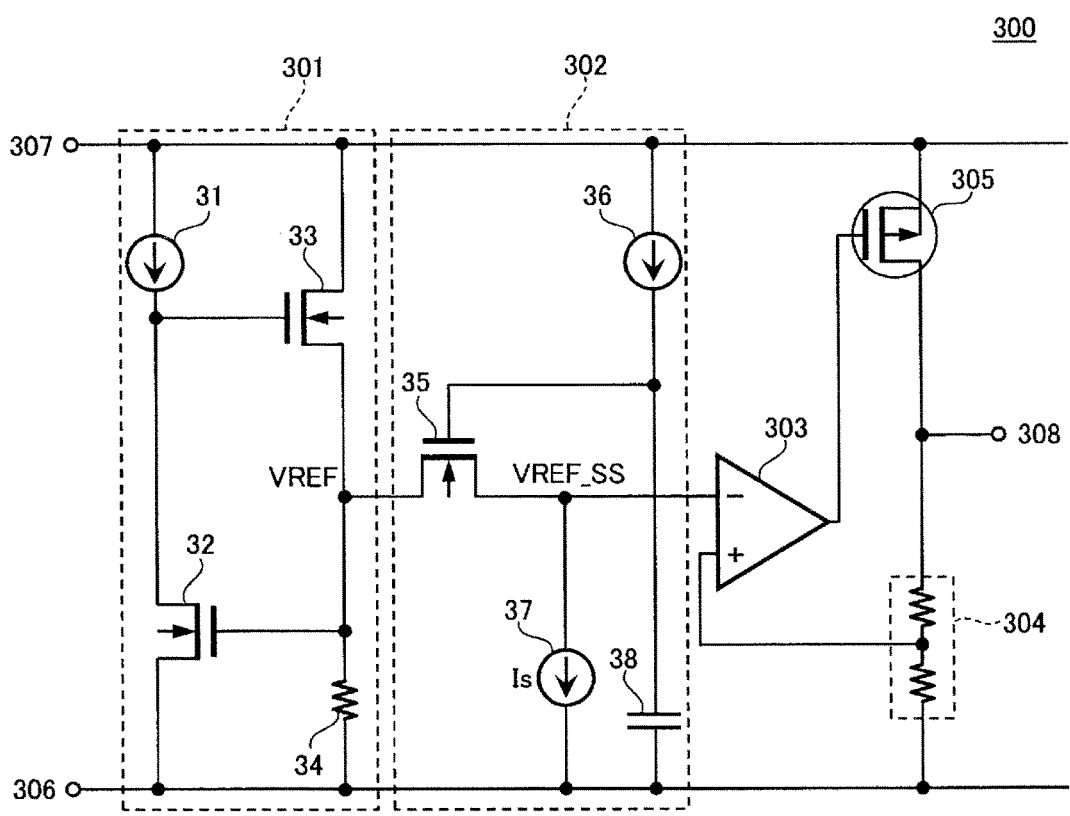
FIG. 3 is a circuit diagram for illustrating a related-art voltage regulator.

FIG. 2 is a circuit diagram for illustrating a voltage regulator 200 according to a second embodiment of the present invention.

When compared with the voltage regulator 100 illustrated in FIG. 1, the voltage regulator 200 includes a reference voltage circuit 201 instead of the reference voltage circuit 101, and a soft-start circuit 202 instead of the soft-start circuit 102. Other parts are the same as those in the voltage regulator 100 illustrated in FIG. 1, and components inside the reference voltage circuit 201 and the soft-start circuit 202 are partly the same as those inside the reference voltage circuit 101 and the soft-start circuit 102 of FIG. 1. Therefore, the same components are denoted by the same reference numerals and overlapping description is appropriately omitted.

First, instead of the analog switch transistor 15 of the reference voltage circuit 101 of FIG. 1, the reference voltage circuit 201 includes an analog switch transistor 25 connected between the source terminal of the NMOS transistor 13 and the resistor 14.

The soft-start circuit 202 has the structure in which the constant current circuit 17 is omitted from the soft-start circuit 102 of FIG. 1.

Next, an operation of the voltage regulator 200 according to the second embodiment is described.

Similarly to FIG. 1, the gate voltage of the NMOS transistor 13 of the reference voltage circuit 201 rises, and the NMOS transistor 13 is placed in an ON state immediately after power supply is started. However, the analog switch transistor 25 is in an OFF state, and a current does not flow through the resistor 14. Thus, a feedback to the gate terminal of the NMOS transistor 12 is not performed. The analog switch transistor 25 has a gate voltage controlled by the control voltage CONT generated at the connection point between the constant current circuit 16 and the capacitor 18, and is configured to cause the drain current to flow when the gate voltage exceeds the threshold voltage, to thereby operate as the source follower circuit. As a result, a current flows through the resistor 14, and the reference voltage VREF generated at a source terminal of the analog switch transistor 25 is fed back to the gate terminal of the NMOS transistor 12 as the feedback voltage VFB. The NMOS transistor 12 is placed in an ON state due to the rise of the feedback voltage VFB. Then, the NMOS transistor 13 causes the drain current to which the ON resistance of the analog switch transistor 25 is added to flow, such that the current that the constant current circuit 11 causes to flow and the drain current of the NMOS transistor 12 are equal. As a result, the reference voltage VREF is generated at the source terminal of the analog switch transistor 25 due to the resistor 14 and the drain current of the NMOS transistor 13. In this way, the reference voltage VREF, which is output from the reference voltage circuit 201, can be directly input to the inverting input terminal of the error amplifier circuit 103.

As described above, in the voltage regulator 200 of this embodiment, as in the first embodiment, the switch transistor is not arranged between the output of the reference voltage circuit 201 and the inverting input terminal of the error amplifier circuit 103. Therefore, the difference between the output voltage of the reference voltage circuit 201 and the voltage of the inverting input terminal of the error amplifier circuit may be prevented from being generated. Further, according to this embodiment, the drain current of the NMOS transistor 13 constantly flows through the analog switch transistor 25. Therefore, the constant current circuit 17, which is arranged in the soft-start circuit 102 of FIG. 1 in order to maintain the source follower operation in the voltage regulator 100, may be omitted. As a result, the voltage regulator 200 can be more reduced in dimension than the voltage regulator 100.

The embodiments of the present invention have been described above, but the present invention is not limited to the above-mentioned embodiments, and it is understood that various modifications can be made thereto without departing from the gist of the present invention.

For example, the NMOS transistor 13 in the embodiments described above may be a depletion-type NMOS transistor and the resistor 14 may be other impedance elements such as saturation-connected MOS transistors or diodes. Further, in the embodiments described above, the NMOS transistor is used as the analog switch transistors 15 and 25, but a PMOS transistor may be used depending on the structure of the soft-start circuit. The soft-start circuits 102 and 202 are not limited to the structure in the embodiments described above as long as the voltage of the gate terminals of the analog switch transistors 15 and 25 may be raised linearly.

What is claimed is:
1. A voltage regulator, comprising:
a soft-start circuit configured to output a control signal that rises linearly at a start of power supply to the voltage regulator;
a reference voltage circuit comprising an analog switch transistor and a reference voltage regulator, the analog switch transistor having a gate controlled by the control signal from the soft-start circuit, a drain configured to receive a preliminary voltage from a voltage output terminal of the reference voltage regulator, and a source configured to output a reference voltage to a voltage control terminal of the reference voltage regulator, the reference voltage being used as a reference voltage for the voltage regulator to operate, the source of the analog switch transistor being connected directly, without any intervening switch, to the voltage control terminal of the reference voltage regulator, and,
wherein the analog switch transistor is turned on by the control signal from the soft-start circuit when the control signal exceeds a first threshold and operable as a source follower circuit to receive, at the drain, the preliminary voltage from the voltage output terminal of the reference voltage regulator and output, at the source, the reference voltage that linearly increases as the control signal from the soft-start circuit linearly increases, and
wherein the reference voltage regulator becomes operational to start regulating the reference voltage equal to a first predetermined potential (FIRST) when the linearly increasing reference voltage outputted at the source of the analog switch transistor exceeds a second threshold, the voltage regulator being operable to increase the preliminary voltage outputted to the drain of the analog switch transistor equal to a second predetermined potential (SECOND), when the reference voltage received from the source of the analog switch transistor decreases below the first predetermined potential (FIRST), to bring the reference voltage up to the first predetermined potential (FIRST), whereas decreasing the preliminary voltage outputted to the drain of the analog switch transistor equal to the second predetermined potential (SECOND), when the reference voltage received from the source of the analog switch transistor increases from the first predetermined potential (FIRST), to bring the reference voltage down to the first predetermined potential (FIRST), wherein the first predetermined potential (FIRST) and the second predetermined potential (SECOND) satisfy the following relationship, where D denotes a voltage drop caused by an ON-resistance of the analog switch transistor,
SECOND=FIRST+D.
2. A voltage regulator, comprising:
a power supply terminal to which an external power voltage is supplied;
an output terminal configured to output a voltage generated by adjusting the external power voltage;
a reference voltage circuit configured to feed back a reference voltage as a feedback voltage and to output the reference voltage;
a soft-start circuit configured to output a control signal for controlling the reference voltage to rise linearly at a start of the power supply;
a voltage divider circuit configured to divide a voltage of the output terminal to generate a divided voltage;
an error amplifier circuit configured to amplify and output a difference between the reference voltage and the divided voltage; and
an output transistor having a gate controlled by an output voltage of the error amplifier circuit, and a drain connected to the output terminal, the reference voltage circuit comprising an analog switch transistor having a gate controlled by the control signal,
the feedback voltage being an output voltage of the analog switch transistor
wherein the reference voltage circuit further comprises:
a first NMOS transistor having a drain terminal connected to the power supply terminal via a first constant current circuit, and a source terminal connected to a ground terminal; and
a second NMOS transistor having a drain terminal connected to the power supply terminal, a gate terminal connected to the drain terminal of the first NMOS transistor, and a source terminal connected to the ground terminal via an impedance element,
wherein the analog switch transistor has a drain terminal connected to the source terminal of the second NMOS transistor, and a source terminal connected to a gate terminal of the first NMOS transistor, and
wherein the reference voltage is a voltage of the source terminal of the analog switch transistor.

3. A voltage regulator according to claim 2,
wherein the soft-start circuit comprises:
a capacitor having one end connected to the power supply terminal via a second constant current circuit, and another end connected to the ground terminal; and
a third constant current circuit connected between the source terminal of the analog switch transistor and the ground terminal, and
wherein the control signal is a signal generated on the one end of the capacitor.

4. A voltage regulator, comprising:
a power supply terminal to which an external power voltage is supplied;
an output terminal configured to output a voltage generated by adjusting the external power voltage;
a reference voltage circuit configured to feed back a reference voltage as a feedback voltage and to output the reference voltage;
a soft-start circuit configured to output a control signal for controlling the reference voltage to rise linearly at a start of the power supply;
a voltage divider circuit configured to divide a voltage of the output terminal to generate a divided voltage;
an error amplifier circuit configured to amplify and output a difference between the reference voltage and the divided voltage; and
an output transistor having a gate controlled by an output voltage of the error amplifier circuit, and a drain connected to the output terminal,
the reference voltage circuit comprising an analog switch transistor having a gate controlled by the control signal,
the feedback voltage being an output voltage of the analog switch transistor
wherein the reference voltage circuit further comprises:
a first NMOS transistor having a drain terminal connected to the power supply terminal via a first constant current circuit, and a source terminal connected to a ground terminal;
a second NMOS transistor having a drain terminal connected to the power supply terminal, and a gate terminal connected to the drain terminal of the first NMOS transistor; and
an impedance element connected between a gate terminal of the first NMOS transistor and the ground terminal,
wherein the analog switch transistor has a drain terminal connected to a source terminal of the second NMOS transistor,
wherein the source terminal is connected to the impedance element, and
wherein the reference voltage is a voltage of the source terminal of the analog switch transistor.

5. A voltage regulator according to claim 4,
wherein the soft-start circuit comprises a capacitor having one end connected to the power supply terminal via a second constant current circuit, and another end connected to the ground terminal, and
wherein the control signal is a signal generated on the one end of the capacitor.

* * * * *